United States Patent
Levy et al.

(10) Patent No.: US 11,611,002 B2
(45) Date of Patent: *Mar. 21, 2023

(54) PHOTODIODE AND/OR PIN DIODE STRUCTURES

(71) Applicant: GLOBALFOUNDRIES U.S. INC., Santa Clara, CA (US)

(72) Inventors: Mark D. Levy, Williston, VT (US); Edward W. Kiewra, South Burlington, VT (US); Siva P. Adusumilli, South Burlington, VT (US); John J. Ellis-Monaghan, Grand Isle, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 124 days.

This patent is subject to a terminal disclaimer.

(21) Appl. No.: 16/935,854

(22) Filed: Jul. 22, 2020

(65) Prior Publication Data

US 2022/0029032 A1  Jan. 27, 2022

(51) Int. Cl.
*H01L 29/868* (2006.01)
*H01L 31/107* (2006.01)
(Continued)

(52) U.S. Cl.
CPC ........ *H01L 29/868* (2013.01); *H01L 29/0649* (2013.01); *H01L 29/66136* (2013.01); *H01L 31/107* (2013.01)

(58) Field of Classification Search
CPC ..... H01L 31/00; H01L 31/02; H01L 31/0352; H01L 31/107; H01L 31/1075;
(Continued)

(56) References Cited

U.S. PATENT DOCUMENTS 2,557,110 A  6/1951  Jaynes
2,619,538 A  11/1952  Grant
(Continued)

FOREIGN PATENT DOCUMENTS

EP           1982356        3/2017
KR     20100070601 A  *  6/2010  ............. B82Y 40/00
(Continued)

OTHER PUBLICATIONS

Yu, "High-Efficiency p-i-n Photodetectors on Selective-Area-Grown Ge for Monolithic Integration", IEEE Electron Device Letters, vol. 30, Issue 11, Nov. 2009, 4 pages.
(Continued)

*Primary Examiner* — Jose R Diaz
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to photodiodes and/or PIN diode structures and methods of manufacture. The structure includes: a spiral fin structure comprising semiconductor substrate material and dielectric material; a photosensitive semiconductor material over sidewalls and a top surface of the spiral fin structure, the photosensitive semiconductor material positioned to capture laterally emitted incident light; a doped semiconductor material above the photosensitive semiconductor material; and contacts electrically contacting the semiconductor substrate material and the doped semiconductor material from a top surface thereof.

19 Claims, 5 Drawing Sheets

(51) Int. Cl.
*H01L 29/66* (2006.01)
*H01L 29/06* (2006.01)

(58) Field of Classification Search
CPC ............... H01L 29/868; H01L 29/0649; H01L 29/66136; H01L 21/30625; H01L 21/76898
See application file for complete search history.

(56) References Cited

U.S. PATENT DOCUMENTS

| | | | |
|---|---|---|---|
| 3,787,871 | A | 1/1974 | Reese |
| 4,481,523 | A | 11/1984 | Osaka |
| 4,799,031 | A | 1/1989 | Lang et al. |
| 4,847,210 | A | 7/1989 | Hwang et al. |
| 5,994,724 | A | 11/1999 | Morikawa |
| 6,147,349 | A | 11/2000 | Ray |
| 6,180,945 | B1 | 1/2001 | Barton et al. |
| 7,002,429 | B2 | 2/2006 | Asao et al. |
| 7,361,526 | B2 | 4/2008 | Maa et al. |
| 7,397,101 | B1 | 7/2008 | Masini et al. |
| 7,777,250 | B2 | 8/2010 | Lochtefeld |
| 7,790,495 | B2 | 9/2010 | Assefa et al. |
| 7,795,064 | B2 | 9/2010 | Pan et al. |
| 7,871,854 | B1 | 1/2011 | Spencer et al. |
| 7,902,540 | B2 | 3/2011 | Cohen |
| 9,064,699 | B2 | 6/2015 | Wang et al. |
| 9,864,138 | B2 | 1/2018 | Coolbaugh et al. |
| 10,157,947 | B2 | 12/2018 | Chen et al. |
| 10,359,569 | B2 | 7/2019 | Dumais |
| 10,600,839 | B2 | 3/2020 | Kurokawa |
| 11,316,064 | B2 * | 4/2022 | Adusumilli ......... H01L 31/1075 |
| 2003/0030814 | A1 | 2/2003 | Osinski et al. |
| 2007/0099315 | A1 | 5/2007 | Maa et al. |
| 2008/0070355 | A1 | 3/2008 | Lochtefeld et al. |
| 2008/0257409 | A1 | 10/2008 | Li et al. |
| 2011/0037133 | A1 | 2/2011 | Su et al. |
| 2012/0213468 | A1 | 8/2012 | Lipson et al. |
| 2013/0149806 | A1 | 6/2013 | Kim |
| 2013/0241021 | A1 | 9/2013 | Stenson |
| 2014/0159183 | A1 | 6/2014 | Na |
| 2014/0185979 | A1 | 7/2014 | Evans et al. |
| 2014/0197507 | A1 | 7/2014 | Assefa et al. |
| 2014/0217269 | A1 | 8/2014 | Guo et al. |
| 2015/0075599 | A1 | 3/2015 | Yu |
| 2015/0091065 | A1 | 4/2015 | Wei et al. |
| 2015/0097256 | A1 | 4/2015 | Ang et al. |
| 2015/0115333 | A1 | 4/2015 | Bobde et al. |
| 2016/0155884 | A1 | 6/2016 | Hon et al. |
| 2017/0365636 | A1 | 12/2017 | Mazzillo et al. |
| 2018/0204761 | A1 | 7/2018 | Feilchenfeld et al. |
| 2020/0020734 | A1 | 1/2020 | Wang et al. |
| 2020/0105812 | A1 | 1/2020 | Sze |
| 2021/0223478 | A1 | 7/2021 | Song et al. |
| 2021/0305313 | A1 | 9/2021 | Pan et al. |
| 2021/0305449 | A1 | 9/2021 | Wang et al. |

FOREIGN PATENT DOCUMENTS

| | | |
|---|---|---|
| KR | 20100070610 | 6/2010 |
| WO | 0147034 | 6/2001 |

OTHER PUBLICATIONS

Knoll, "High-Performance BiCMOS Si Photonics Platform", IEEE, 2015, 9 pages.
Liao et al., "36 GHz submicron silicon waveguide germanium photodetector", Optics Express, vol. 19, Issue 11, May 20, 2011, 6 pages.
Huang et al., "Germanium on Silicon Avalanche Photodiode", IEEE Journal of Selected Topics in Quantum Electronics, vol. 24, No. 2, Mar./Apr. 2018, 11 pages.
Jutzi et al., "Ge-on-Si Vertical Incidence Photodiodes With 39-GHz Bandwidth", IEEE Photonics Technology Letters, vol. 17, Issue 7, Jul. 2005, 3 pages.
Koester et al., "Germanium-on-Insulator Photodetectors", IEEE, Oct. 2005, 3 pages.
Application and Drawings for U.S. Appl. No. 16/844,606, filed Apr. 9, 2020, 30 pages.
Application and Drawings for U.S. Appl. No. 16/887,375, filed May 29, 2020, 26 pages.
Application and Drawings for U.S. Appl. No. 16/531,819, filed Aug. 5, 2019, 25 pages.
Application and Drawings for U.S. Appl. No. 16/741,792, filed Jan. 14, 2020, 38 pages.
Response to Office Action in U.S. Appl. No. 16/844,606 dated Oct. 1, 2021, 14 pages.
Office Action in U.S. Appl. No. 16/887,375 dated Oct. 13, 2021, 13 pages.
Application and Drawings for U.S. Appl. No. 16/544,074, filed Aug. 19, 2019, 26 pages.
Application and Drawings for U.S. Appl. No. 17/065,862, filed Oct. 8, 2020, 22 pages.
Notice of Allowance in U.S. Appl. No. 16/531,819 dated Apr. 28, 2021, 9 pages.
Office Action in U.S. Appl. No. 16/531,819 dated Jul. 1, 2021, 12 pages.
Final Office Action in U.S. Appl. No. 16/844,606 dated Oct. 29, 2021, 9 pages.
Response to Final Office Action in U.S. Appl. No. 16/844,606 dated Nov. 23, 2021, 9 pages.
Second Response to Final Office Action in U.S. Appl. No. 16/844,606 dated Jan. 5, 2022, 9 pages.
Response to Office Action in U.S. Appl. No. 16/887,375 dated Jan. 13, 2022, 8 pages.
Notice of Allowance in U.S. Appl. No. 16/844,606 dated Feb. 1, 2022, 9 pages.
Taiwanese Office Action in TW Application No. 110108280 dated Jan. 13, 2022, 16 pages.
Notice of Allowance in U.S. Appl. No. 16/887,375 dated Jan. 20, 2022, 9 pages.
Office Action in U.S. Appl. No. 17/065,862 dated Jan. 27, 2022, 14 pages.
Response to Office Action in U.S. Appl. No. 17/065,862 dated Mar. 25, 2022, 11 pages.
Notice of Allowance in U.S. Appl. No. 17/065,862 dated May 18, 2022, 7 pages.
Taiwanese Notice of Allowance in TW Application No. 110108280 dated May 4, 2022, 4 pages.
Foreign Office Action dated Jul. 29, 2022 in related Germany Application No. 10 2021 122 575.2, 6 pages.
Office Action in U.S. Appl. No. 17/863,922 dated Nov. 8, 2022, 8 pages.
Response to Office Action in U.S. Appl. No. 17/863,922 dated Feb. 7, 2023, 8 pages.

* cited by examiner

PHOTODIODE AND/OR PIN DIODE STRUCTURES

FIELD OF THE INVENTION

The present disclosure relates to semiconductor structures and, more particularly, to photodiodes and/or PIN diode structures and methods of manufacture.

BACKGROUND

An avalanche photodiode (APD) is a highly sensitive semiconductor photodiode that exploits the photoelectric effect to convert light into electricity. From a functional standpoint, the avalanche photodiode can be regarded as the semiconductor analog of photomultipliers. Typical applications for avalanche photodiodes are long-range fiber-optic telecommunication and quantum sensing for control algorithms. Newer applications include positron emission tomography and particle physics.

Avalanche photodiode applicability and usefulness depends on many parameters. Two factors, for example, are quantum efficiency and total leakage. Quantum efficiency indicates how well incident optical photons are absorbed and then used to generate primary charge carriers; whereas, total leakage current is the sum of the dark current, photocurrent and noise.

Photodiode sensitivity is dependent on the length of the path of light through the photosensitive material and the ability of generated carrier pairs to reach the electrode/contact/cathode. In conventional structures, the carriers travel in a two dimensional pathway, e.g., vertically or laterally, which results in a long pathway. Due to the longer pathways of conventional avalanche photodiodes, there is a high frequency of photon recombination within the photosensitive material resulting in signal loss or weakening of the signal, itself. Moreover, the photosensitive material itself needs to be very thick, which is expensive and time consuming to grow, and which can make integration with other circuit elements more challenging.

SUMMARY

In an aspect of the disclosure, a structure comprises: a spiral fin structure comprising semiconductor substrate material and dielectric material; a photosensitive semiconductor material over sidewalls and a top surface of the spiral fin structure, the photosensitive semiconductor material positioned to capture laterally emitted incident light; a doped semiconductor material above the photosensitive semiconductor material; and contacts electrically contacting the semiconductor substrate material and the doped semiconductor material from a top surface thereof.

In an aspect of the disclosure, a structure comprises: a spiral fin structure comprising semiconductor substrate material of substrate on insulator (SOI) technology; a shallow trench isolation region within a body of the spiral fin structure; a first semiconductor material lining sidewalls and a top surface of the spiral fin structure; a photosensitive semiconductor material over the doped semiconductor material and an insulator layer of the SOI technology; a doped semiconductor material above the photosensitive semiconductor material; and contacts electrically contacting the semiconductor substrate material and the second semiconductor material.

In an aspect of the disclosure, a method comprises: forming a first shallow trench isolation structure in a spiral configuration within semiconductor material of substrate on insulator (SOI) technology; forming a second shallow trench isolation structure adjacent to the first shallow trench isolation structure; forming a spiral fin structure comprising the semiconductor material and the first shallow trench isolation structure, the spiral fin structure being formed above an insulator layer of the SOI technology and bounded by the second shallow trench isolation structure; lining sidewalls and a top surface of the spiral fin structure with a first semiconductor material; forming a photosensitive semiconductor material over the first semiconductor material and the insulator layer; forming a second semiconductor material above the photosensitive semiconductor material; and forming a first contact electrically contacting the semiconductor substrate material, on a side of the spiral fin structure, and a second contact electrically contacting the second semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to photodiodes and/or PIN diode structures and methods of manufacture. More specifically, the present disclosure relates to spiral shaped photodiodes and/or pin diode structures composed from semiconductor fin structures. Advantageously, the present disclosure provides a decrease time for growth of photodiode material (e.g., Ge) by providing an increased semiconductor seed surface area, while also allowing a thinner photodiode material (e.g., Ge) region needed to absorb light and an overall reduction of area versus linear photodetectors. In addition, the structures described herein provide an increase in detection efficiency due to a shorter pathway for carrier formation and a longer pathway for light absorption through the photodetector material, e.g., Ge.

In embodiments, the photodiode is a spiral configured photodiode composed of photodetector material, e.g., Ge, formed on a spiral fin structure of substrate material. The spiral fin structure includes insulator material within the body of the fin structure, itself, and is surrounded by a shallow trench isolation region outside of the spiral fin structure. The shallow trench isolation region outside of the spiral fin structure will guide light to the photodetector material to "trap" the incident light thereby maximizing chances of carrier formation. The photodiode is also integrated into semiconductor on insulator (SOI) technologies suitable for lateral illumination. Moreover, the photodiode can be integrated with waveguide structures, laterally spaced therefrom.

As will be described herein, the larger surface area of the spiral fin structure will facilitate the growth of the photodetector material, e.g., Ge. Also, the spiral fin structure within the Ge detector region will provide for improved efficiency by increasing a surface capture area. For example, the spiral shaped capture area will have a larger surface area compared to linear shapes. Accordingly, the spiral shaped photodiode can provide improved efficiency by increasing the surface area compared to a concentric circle configuration, as well as avoiding the risk of a destructive interference present in a concentric circle or simple ring configurations.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures use three basic building blocks: (i) deposition of thin films of material on a substrate, (ii) applying a patterned mask on top of the films by photolithographic imaging, and (iii) etching the films selectively to the mask.

Figure 1:
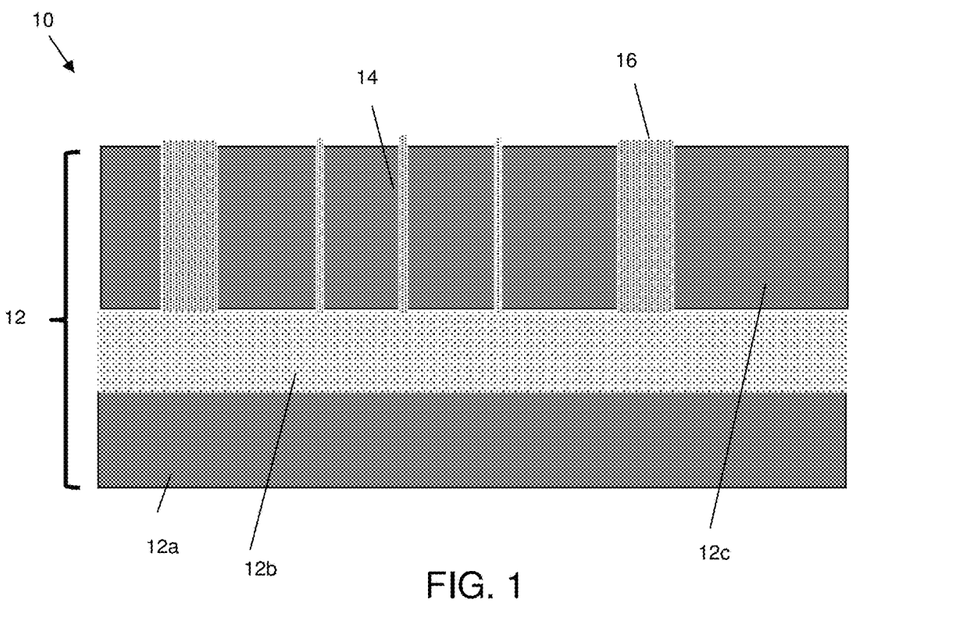
FIG. 1 shows a substrate with shallow trench isolation regions, amongst other features, and respective fabrication processes in accordance with aspects of the present disclosure.

FIG. 1 shows a substrate with shallow trench isolation regions, amongst other features, and respective fabrication processes in accordance with aspects of the present disclosure. More specifically, the structure 10 includes a substrate 12 preferably comprising semiconductor on insulator (SOI) technologies. Alternative, the substrate 12 can be a BULK Si implementation.

In the SOI technologies, the substrate 12 incudes a semiconductor wafer 12a with an insulator layer 12b and semiconductor substrate 12c. The insulator layer 12b can be any suitable insulator material including silicon oxide, sapphire, other suitable insulating materials, and/or combinations thereof. An exemplary insulator layer 12b is buried oxide (BOX) formed on the semiconductor wafer 12a using separation by implantation of oxygen (SIMOX), oxidation, deposition, and/or other suitable processes. The semiconductor wafer 12a and semiconductor substrate 12c can include any suitable semiconductor material, e.g., single crystalline Si material, by way of further examples, the semiconductor substrate 12c can be composed of SiC, GaAs, InAs, InP, and other III/V or II/VI compound semiconductors. In preferred embodiments, the semiconductor substrate 12c is a n-type substrate.

To form the shallow isolation regions 14, 16, trenches are formed in the semiconductor substrate 12c using conventional lithography and etching processes known to those of skill in the art. In one non-limiting example, the trenches extend to the underlying insulator layer 12b, with one trench being in a spiral pattern. In forming the trenches, a resist formed over the semiconductor substrate 12c is exposed to energy (light) to form a pattern (opening). An etching process with a selective chemistry, e.g., reactive ion etching (RIE), will be used to form the trenches in the semiconductor substrate 12c. A post-etch clean such as HF will remove contaminants from the surfaces of the trenches, thereby ensuring a clean surface of exposed semiconductor material of the bottom surface and sidewalls of the trenches.

Following resist removal by a conventional oxygen ashing process or other known stripants, an insulator material can be deposited within the trenches to form the shallow trench isolation regions 14, 16. In embodiments, the shallow trench isolation region 14 is provided in a spiral configuration; whereas, the shallow trench isolation region 16 is formed outside (adjacent) of the shallow trench isolation region 14. The insulator material can be an oxide material deposited by conventional deposition methods including, e.g., a chemical vapor deposition (CVD) process. In embodiments, the insulator material exhibits reflective properties, which is designed to reflect light back into photodiode material. After deposition of the insulator material, e.g., $SiO_2$, a pad nitride layer on top of the semiconductor substrate 12c can be removed, resulting in the shallow trench isolation regions 14, 16 extending above a surface of the semiconductor substrate 12c.

Figure 2:
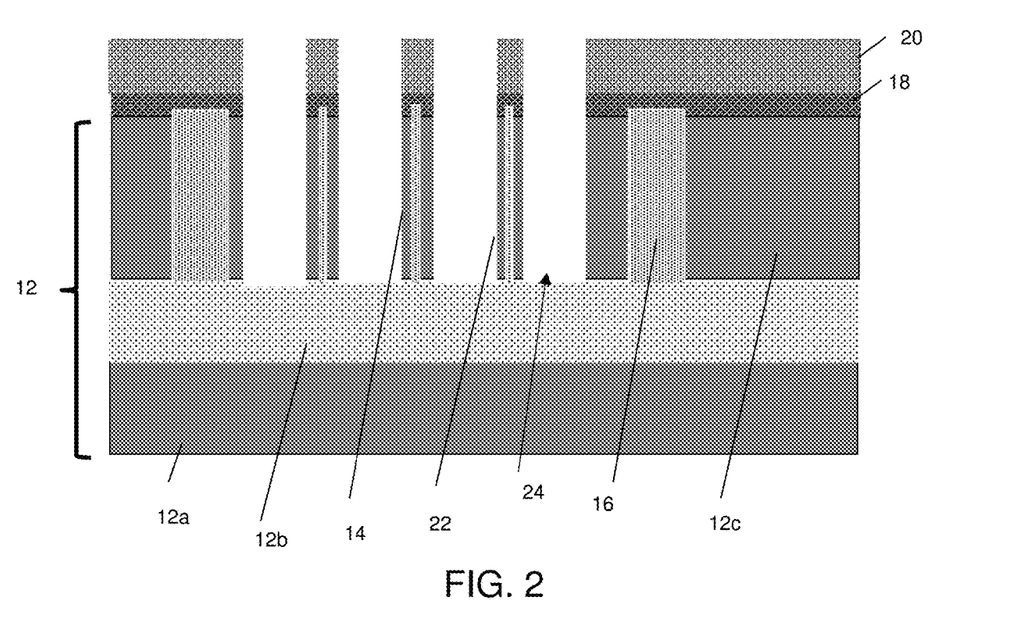
FIG. 2 shows a spiral fin structure formed from the substrate, amongst other features, and respective fabrication processes in accordance with aspects of the present disclosure.

Referring to FIG. 2, a hardmask 18 is deposited on the semiconductor substrate 12c. In embodiments, the hardmask 18 can be nitride or other hardmask material deposited by known deposition methods such as, e.g., a CVD process. In embodiments, the hardmask 18 will prevent epitaxial growth of semiconductor material on the semiconductor substrate 12c in subsequent processes.

Following the deposition of the hardmask 18, a spiral fin structure 22 will be formed in the semiconductor substrate 12c using conventional etching processes. For example, the spiral fin structure 22 can be formed by a secondary etching process using resist material 20 to form a spiral trench 24, thereby defining the spiral fin structure 22. Alternatively, the spiral fin structure 22 can be formed by a sidewall imaging technique (SIT) as is known in the art such that no further explanation is required for a complete understanding of the present disclosure.

In embodiments, the body of the spiral fin structure 22 includes the spiral shallow trench isolation region 14, while also being bounded by the shallow trench isolation structure 16 and the underlying insulator material 12b. After the etching process, the resist 20 can be removed by conventional oxygen ashing or use of other stripants.

Figure 3:
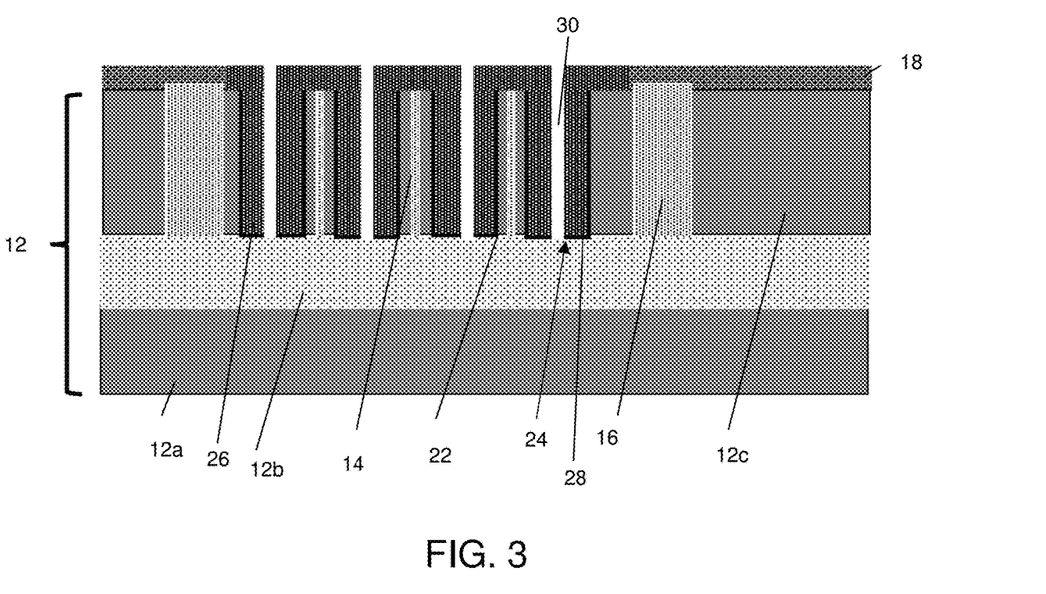
FIG. 3 shows photodiode material filling spaces between the spiral fin structure, amongst other features, and respective fabrication processes in accordance with aspects of the present disclosure.

In FIG. 3, the hardmask 18 over the spiral fin structure 22 can be removed by conventional patterning processes, e.g., lithography and etching process, to expose the semiconductor material 12c of the spiral fin structure 22. The removal of the hardmask 18 will allow epitaxially grown semiconductor material to deposit on all exposed surfaces of the spiral fin structure 22. For example, photodiode material 26, e.g., Ge based material, with an optional liner 28 can be grown within the spiral trench 24, e.g., on sidewalls and a top surface of the spiral fin structure 22. The remaining hardmask 18 will prevent growth of the epitaxially semiconductor material outside of the spiral fin structure 22.

In embodiments, the liner 28 can be an epitaxial grown semiconductor material, e.g., a P-type semiconductor material, preferably composed of the same material as the substrate 12c, e.g., Si. The photodiode material 26 is epitaxially grown on the liner 28 or, optionally, directly on the semiconductor material 12c of the spiral fin structure 22. In embodiments, the photodiode material 26 is an intrinsic photosensitive semiconductor material (non-doped), preferably comprising Ge material which offers superior responsivity. In alternative embodiments, the photodiode material 26 can be Si, SiGe, etc. In preferred implementations, the epitaxial growth of the photodiode material 26 will not result in a pinch-off phenomenon, thereby leaving an opening 30 in within spaces formed between the spiral fin structure 22.

As further shown in FIG. 3, the photodiode material 26 will be bounded (e.g., surrounded) by the shallow trench isolation region 14 within the body of the spiral fin structure 22, the shallow trench isolation region 16 adjacent to the spiral fin structure 22 and the underlying insulator material 12c. In this way, the reflective surfaces of the insulator materials will surround, e.g., be provided on all sides, the photodiode material 26 such that light can be guided back into the photodiode material 26 to maximize carrier formation, i.e., achieve high efficiency. The photodiode material 26 will also be in a spiral shape due its placement within the spiral trench, which provides a longer path (from one end to its center) to maximize absorption of any incident light.

Figure 4:
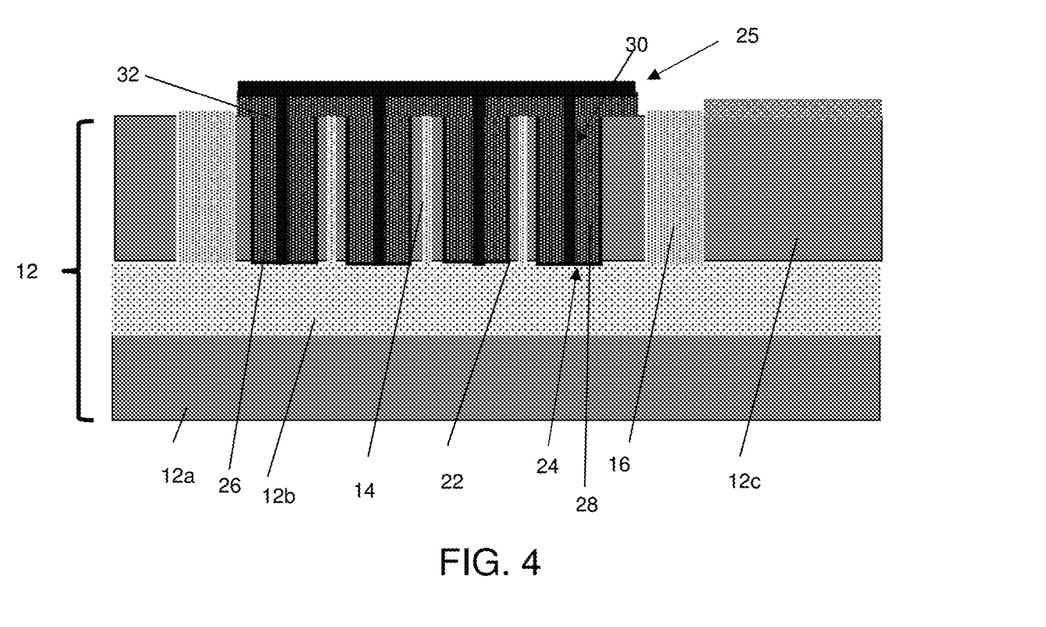
FIG. 4 shows a spiral photodiode in accordance with aspects of the present disclosure.

In FIG. 4, a semiconductor material 32 is deposited in the opening 30 directly on the photodiode material 26 (e.g., Ge). In embodiments, the semiconductor material 32 will also grow on the upper, exposed surface of the photodiode material 26 (e.g., Ge). The semiconductor material 32 is preferably the same material as the liner 28. For example, the semiconductor material 32 is a P+ type semiconductor material (e.g., epitaxial Si or polysilicon). In FIG. 4, the hardmask 18 is removed by a selective etching process, after the growth of the semiconductor material 32.

In embodiments, the semiconductor material 32 is a P+ plug to provide biasing for operation of an avalanche photodiode 25. In this way, a N-P-I-P photodiode 25 can be formed. More specifically, the P+ material, e.g., semiconductor material 32 and the P+ material (e.g., liner 28) on the sides and bottom of the Ge material (e.g., semiconductor material 26) create an avalanche photodiode 25, which is biased in three dimensions, increasing the likelihood of picking up a signal before carrier recombination.

Figure 5:
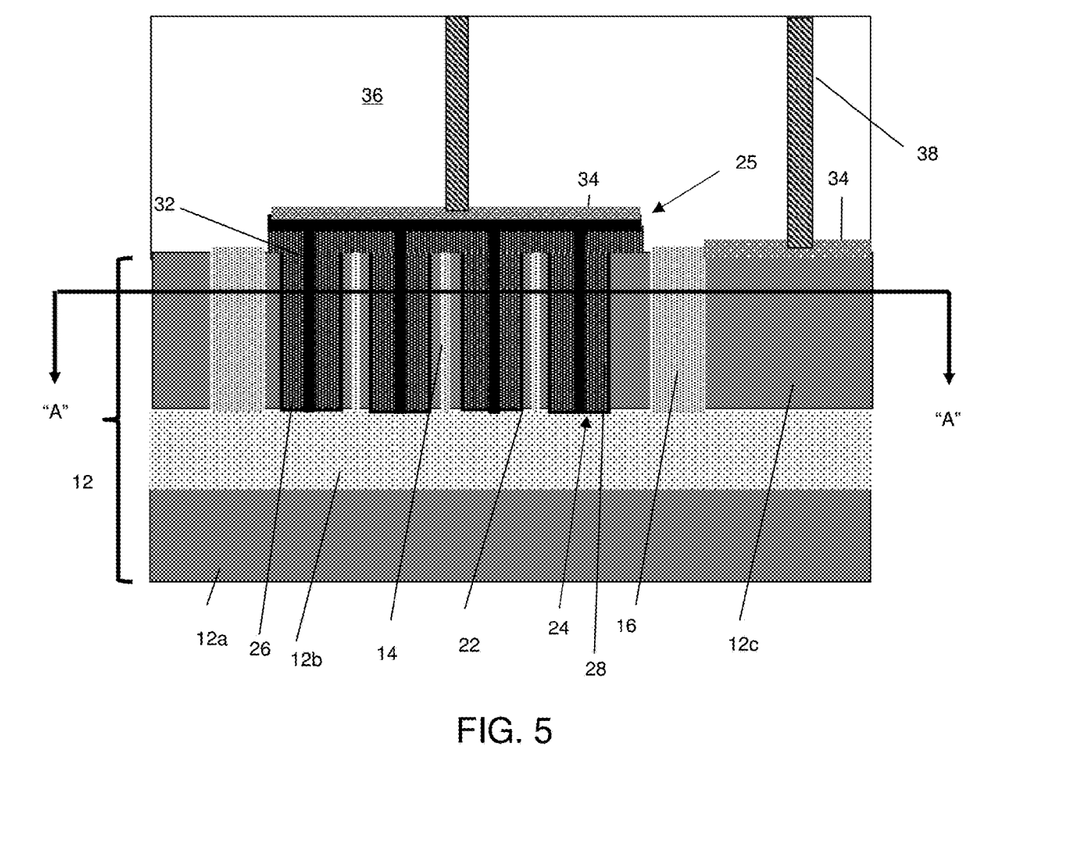
FIG. 5 shows contact formation to the spiral photodiode, amongst other features, and respective fabrication processes in accordance with aspects of the present disclosure.

FIG. 5 shows contact formation to the photodiode 25, amongst other features, and respective fabrication processes. In FIG. 5, a silicide contact 34 is formed on an exposed surface of the semiconductor substrate 12c and top of the photodiode 25, e.g., on semiconductor material 32. As should be understood by those of skill in the art, the silicide process begins with deposition and patterning of a thin transition metal layer, e.g., nickel, cobalt or titanium, over the semiconductor substrate 12c and top of the photodiode 25. After deposition and patterning of the material, the structure is heated allowing the transition metal to react with exposed silicon (or other semiconductor material as described herein) forming a low-resistance transition metal silicide. Following the reaction, any remaining transition metal is removed by chemical etching, leaving the silicide contacts 34.

Still referring to FIG. 5, an interlevel dielectric material (e.g., oxide) 36 is deposited over the structure. A trench is formed in the interlevel dielectric material (e.g., oxide) 36, aligned with and exposing a top surface of silicide contacts 34. The trench is formed by conventional lithography and etching processes as already described herein. The trench is filled with a metal material, e.g., tungsten, to form contacts 38. As should be understood by those of skill in the art, the contact 38 on the side of the photodiode 25 will detect the current generated by the photons hitting the photodiode 25.

Although the photodiode 25 is primarily designed for lateral illumination, it is recognized that the contact 38 over the photodiode 25 can be arranged at an edge of the photodiode 25 for frontside illumination. This frontside illumination is possible due to the fact that the contact 38 will not significantly interfere with light entering into the photodiode 25 from the frontside (e.g., top). The photodiode 25 can also be used for backside illumination.

Figure 6:
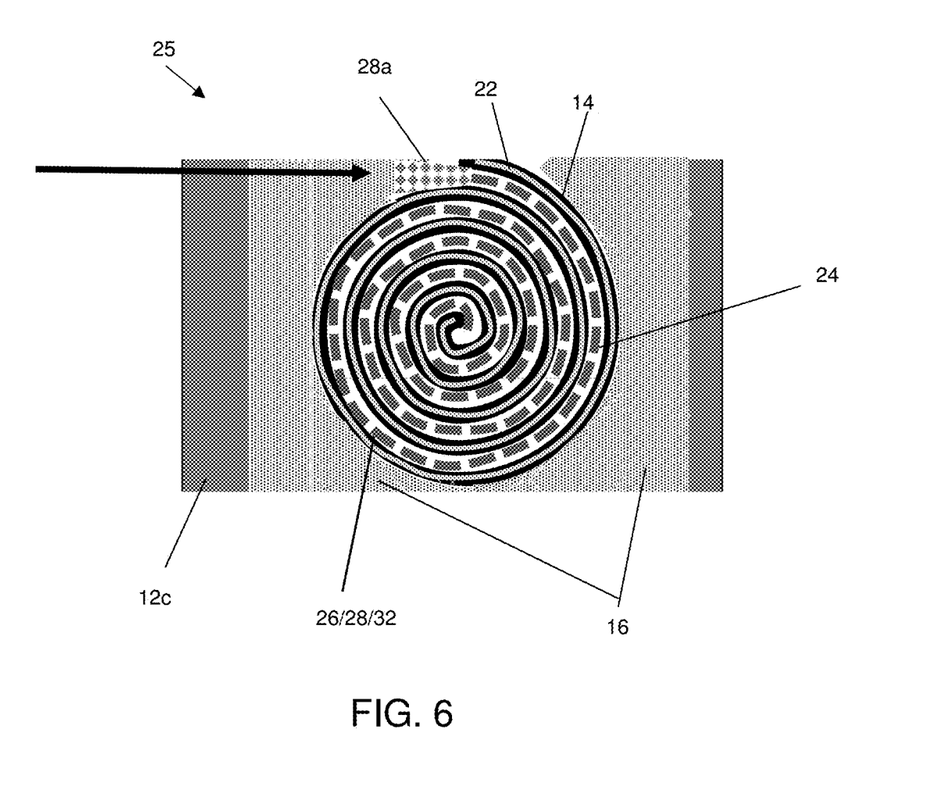
FIG. 6 is a top view of the photodiode structure along line "A"-"A" of FIG. 5.

FIG. 6 is a top view of the photodiode 25 along the plane denoted by line "A"-"A" of FIG. 5. In particular, FIG. 6 shows a cut-away top view of the spiral fin structure 22 with the liner 28, photodetector material 26 and P+ plug material 32 deposited within the space 24. As shown in this view, the spiral fin structure 22 is a continuous structure which is bounded by the shallow trench isolation regions 14, 16, over the insulator layer 12c. As further seen in this view, the body of the spiral fin structure 22 includes the shallow trench isolation region 14 along its length. In addition, the spiral fin structure 22 will be located on the insulator material 12b of the SOI technologies. Accordingly, in this manner, the photodiode 25 will be surrounded by reflective material that will reflect light back into the photodetector material 26.

Moreover, the photodetector material 28 can include a cone or tapered section 28a, which laterally guides light into the photodiode 25 to the center of the spiral configuration. The incident light can be provided laterally to the photodiode 25 by a waveguide structure, fiber or other lateral incident light (each of which is represented by the arrow) located on the same plane as the photodiode 25.

Figure 7:
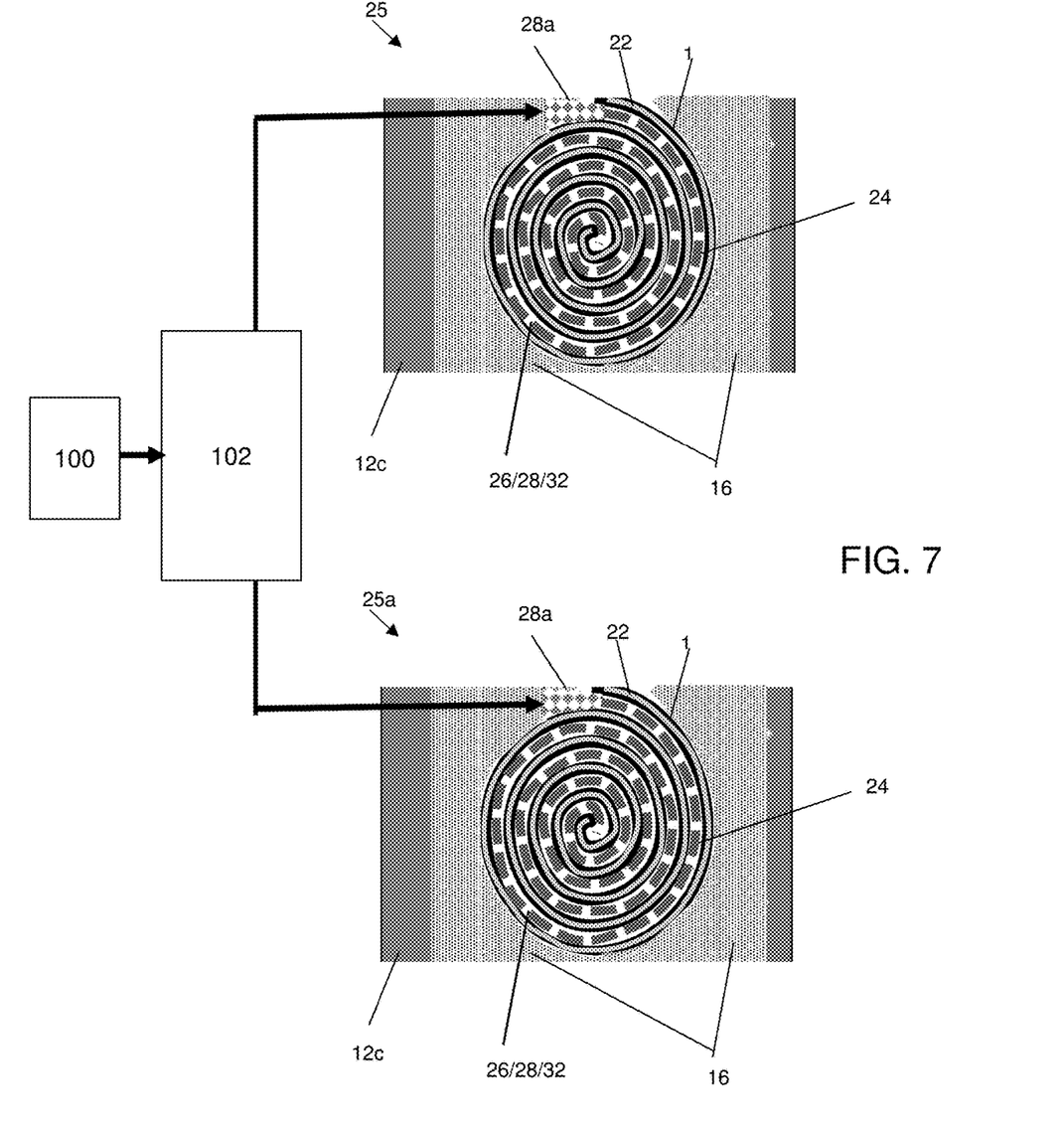
FIG. 7 shows photodiodes coupled to a demultiplexer/splitter in accordance with an aspects of the present disclosure.

FIG. 7 shows photodiodes 25, 25a coupled to a waveguide 100 by a demultiplexer/splitter 102. In this implementation, different photodiodes 25, 25a can detect different wavelengths using the demultiplexer/splitter 102. More specifically, light from a waveguide 100 can be split into different wavelengths by the demultiplexer/splitter 102 and then each separate wavelength can be laterally guided to a different photodiode 25, 25a for detection. In this embodiment, the different photodiodes 25, 25a are detecting the separate wavelength through lateral illumination.

The structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a spiral fin structure comprising semiconductor substrate material over dielectric material;
   a photosensitive semiconductor material over sidewalls and a top surface of the spiral fin structure, the photosensitive semiconductor material positioned to capture laterally emitted incident light;
   a doped semiconductor material above the photosensitive semiconductor material; and
   contacts electrically contacting the semiconductor substrate material and the doped semiconductor material from a top surface thereof, wherein an illumination source is at least one of a waveguide structure and a fiber optic in a same plane as the photosensitive semiconductor material.

2. The structure of claim 1, wherein the photosensitive semiconductor material is in a spiral configuration and is an intrinsic material different from the semiconductor substrate material.

3. The structure of claim 1, wherein the semiconductor substrate material of the spiral fin structure comprises semiconductor material of substrate on insulator (SOI) technology, and an insulator layer of the SOI technology is underlying the photosensitive semiconductor material.

4. The structure of claim 3, wherein the dielectric material is within a body of the spiral fin structure.

5. The structure of claim 4, further comprising a shallow trench isolation structure adjacent to the spiral fin structure, wherein the photosensitive semiconductor material is surrounded by the shallow trench isolation region within the body of the spiral fin structure, the shallow trench isolation structure and the underlying insulator material of the SOI technology.

6. The structure of claim 5, wherein the shallow trench isolation region within the body of the spiral fin structure, the shallow trench isolation structure and the underlying insulator material comprise reflective material.

7. The structure of claim 6, further comprising a semiconductor liner material which lines the spiral fin structure below the photosensitive semiconductor material, wherein:
   the semiconductor substrate material is N-type material;
   the semiconductor liner material is P-type material;
   the photosensitive semiconductor material is intrinsic material; and
   the doped semiconductor material is P-type material.

8. The structure of claim 1, further comprising a silicide on the top surface of the doped semiconductor material and the semiconductor substrate material, wherein a first contact and a second contact of the contacts are in contact with the silicide.

9. The structure of claim 1, wherein the waveguide structure is at least two waveguide structures in the same plane as the photosensitive semiconductor material, each of which is coupled to a demultiplexer/splitter.

10. A structure comprising:
    a spiral fin structure comprising semiconductor substrate material of substrate on insulator (SOI) technology;
    a shallow trench isolation region within a body of the spiral fin structure;
    a first semiconductor material lining sidewalls and a top surface of the spiral fin structure;
    a photosensitive semiconductor material over the first semiconductor material and an insulator layer of the SOI technology;
    a second semiconductor material above the photosensitive semiconductor material; and
    contacts electrically contacting the semiconductor substrate material and the second semiconductor material.

11. The structure of claim 10, wherein the photosensitive semiconductor material is in a spiral configuration and is an intrinsic material different from the semiconductor substrate material.

12. The structure of claim 10, further comprising a shallow trench isolation structure adjacent to the spiral fin structure, wherein the photosensitive semiconductor material is surrounded by the shallow trench isolation region within the body of the spiral fin structure, the shallow trench isolation structure and the insulator layer of the SOI technology.

13. The structure of claim 12, wherein the shallow trench isolation region within the body of the spiral fin structure, the shallow trench isolation structure and the underlying insulator material comprise reflective material.

14. The structure of claim 10, wherein:
    the semiconductor substrate material is N-type material;
    the first semiconductor material is P-type material;
    the photosensitive semiconductor material is intrinsic material; and
    the second semiconductor material is P-type material.

15. The structure of claim 14, further comprising a silicide on a top surface of the second semiconductor material and the semiconductor substrate material, wherein a first contact and a second contact of the contacts are in contact with the silicide.

16. The structure of claim 10, further comprising an illumination source on a same plane as the photosensitive semiconductor material such that the photosensitive semiconductor material receives light laterally from the photosensitive semiconductor material.

17. The structure of claim 16, wherein the illumination source is at least waveguide structure and a fiber optic in the same plane as the photosensitive semiconductor material.

18. The structure of claim 17, wherein the at least one waveguide structure is at least two waveguide structure in the same plane as the photosensitive semiconductor material, each of which are coupled to a demultiplexer/splitter.

19. A method comprising:
    forming a first shallow trench isolation structure in a spiral configuration within semiconductor material of substrate on insulator (SOI) technology;
    forming a second shallow trench isolation structure adjacent to the first shallow trench isolation structure;
    forming a spiral fin structure comprising the semiconductor material and the first shallow trench isolation structure, the spiral fin structure being formed above an insulator layer of the SOI technology and bounded by the second shallow trench isolation structure;
    lining sidewalls and a top surface of the spiral fin structure with a first semiconductor material;
    forming a photosensitive semiconductor material over the first semiconductor material and the insulator layer;

forming a second semiconductor material above the photosensitive semiconductor material; and forming a first contact electrically contacting the semiconductor substrate material, on a side of the spiral fin structure, and a second contact electrically contacting the second semiconductor material.

\* \* \* \* \*